United States Patent
Babb et al.

(10) Patent No.: US 7,319,612 B2
(45) Date of Patent: Jan. 15, 2008

(54) PERFORMING MULTIPLE READ OPERATIONS VIA A SINGLE READ COMMAND

(75) Inventors: Edward Babb, Rescue, CA (US); Prashanti Govindu, Santa Clara, CA (US); Ahmed T. Sayed, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 11/132,353

(22) Filed: May 18, 2005

(65) Prior Publication Data

US 2006/0262608 A1    Nov. 23, 2006

(51) Int. Cl.
    *G11C 16/26* (2006.01)
(52) U.S. Cl. .......................... 365/185.08; 365/185.09; 365/185.17; 365/185.33
(58) Field of Classification Search .......... 365/185.08, 365/185.09, 185.12, 185.17, 185.33, 185.19
    See application file for complete search history.

(56) References Cited

U.S. PATENT DOCUMENTS

| 5,896,338 A | 4/1999 | Landgraf et al. ............ 365/226 |
| 6,963,518 B2 * | 11/2005 | Sasaki et al. ................ 365/236 |
| 2004/0177054 A1 * | 9/2004 | Stern et al. ..................... 707/1 |
| 2004/0268075 A1 | 12/2004 | Qawami et al. ............ 711/167 |
| 2005/0185472 A1 * | 8/2005 | Randell et al. ......... 365/185.33 |
| 2006/0067123 A1 * | 3/2006 | Jigour et al. ........... 365/185.05 |

OTHER PUBLICATIONS

"Two Technologies Compared: NOR vs. NAND White Paper", M-Systems Flash Disk Pioneers, Jul. 2003, pp. 1-14.

* cited by examiner

*Primary Examiner*—Andrew Q. Tran
(74) *Attorney, Agent, or Firm*—Trop, Pruner & Hu, P.C.

(57) ABSTRACT

In one embodiment, the present invention includes a method for performing a plurality of read operations on a nonvolatile array of a memory according to a single read command, and storing data from the plurality of read operations in a volatile array of the memory. In some embodiments, the nonvolatile array may be a flash-based array and the volatile array may be a random access memory.

5 Claims, 5 Drawing Sheets

PERFORMING MULTIPLE READ OPERATIONS VIA A SINGLE READ COMMAND

BACKGROUND

Embodiments of the present invention relate to memory technology, and more particularly to the handling of read operations in a memory.

Various memory technologies exist. Semiconductor memories are used in many systems including servers, personal computers, cellular telephones, personal digital assistants (PDAs), portable media players and the like. Many systems use multiple memories, including random access memories, such as dynamic random access memories (DRAMs) and static random access memories (SRAMs), and other memories, such as flash memories. Flash memory is a high-speed electrically erasable programmable read only memory (EEPROM) in which erasing and programming is performed on blocks of data.

Different types of flash memories exist, including flash memories based on NOT-OR (NOR) technology and NOT-AND (NAND) technology. These different types of flash memory have different characteristics. Typically, NOR-based flash designs read a single data group from memory at a time. A second read cannot be initiated until the prior read is latched out of the memory. The first data word is available after a short latency or delay. Subsequent data words follow at a rate determined by the clock frequency. Accordingly, NOR-based flash devices are often used for code storage, and more particularly for storage of code used for execute-in-place (XIP) operation. In contrast, NAND-based flash devices have a long latency before data is available from the device, and such NAND devices are suitable for data storage applications.

Oftentimes it is unsuitable to use multiple memories for both code and data storage. Accordingly, a need exists for improved memory technologies.

DETAILED DESCRIPTION

In various embodiments, a memory device may include multiple arrays, including volatile and nonvolatile arrays. The nonvolatile arrays may be used to store information for long-term periods. That is, nonvolatile arrays may maintain information, even in the absence of power to the memory device. In contrast, a volatile array loses the information stored therein upon loss of power. As used herein, the terms "information" and "data" may be used interchangeably, and may refer to both data and instructions.

To effect retrieval of information stored in such a memory device, a host controller of a system including the memory device may send a single read command to the memory device, in some embodiments. Based on this single read command, the memory device may obtain requested information from one or more nonvolatile arrays of the memory device and store the information into one or more volatile arrays of the memory device. Then, the information may be downloaded for use in the system, e.g., by the host controller. In such manner, desired information may be retrieved from a memory device while allowing the host controller to perform other operations while the information is being obtained.

Figure 1:
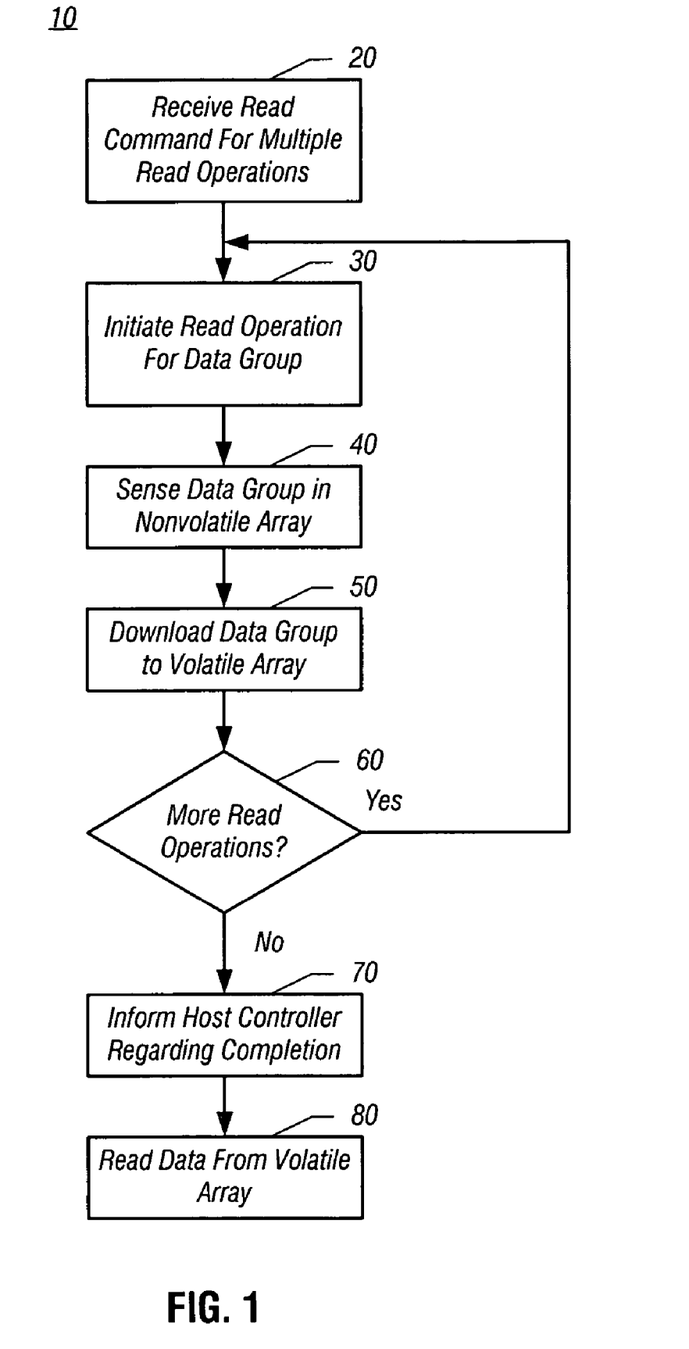
FIG. 1 is a flow diagram of a method in accordance with one embodiment of the present invention.

Referring now to FIG. 1, shown is a flow diagram of a method in accordance with one embodiment of the present invention. As shown in FIG. 1, method 10 may begin by receiving a read command for multiple read operations (block 20). For example, the read command may be provided to a controller within a memory device from another portion of a system that includes the memory device. While the scope of the present invention is not so limited, in some embodiments a memory device may be incorporated into a processor-based system, and more particularly a mobile device. The mobile device may include an applications processor or other controller circuitry that may request information from the memory device.

Based on the read command, the memory device may initiate a read operation for a first data group (block 30). That is, a first read operation may be performed to obtain information of a given size. Typically, the size of a given read operation may correspond to the size of sensing circuitry within the memory. The given size may be one or more units of data. A unit of data may be a byte of data, a word of data, a double word of data, or another size. It should be noted that the terms "byte," "word," "double word," are terms denoting different units of data. As an example, in certain embodiments a byte of data may refer to eight bits of data, a word may refer to 16 bits of data, and a double word may refer to 32 bits of data, although the scope of the present invention is not limited in this regard. Various controller and timing circuitry within the memory device may be used to initiate the read operation.

When the data group is accessed in the memory, next it may be sensed (block 40). More specifically, the data group may be sensed using sensing circuitry of a nonvolatile array of the memory device. The sensed data may then be downloaded to a volatile array of the memory device (block 50). While not shown in FIG. 1, it is to be understood that certain processing activities such as error correction may occur before the data group is written into the volatile array.

While the sensed data is being written into the volatile array, it may be determined whether more read operations are desired (diamond 60). Thus although shown in FIG. 1 as occurring after the downloading of the data group to the volatile array, in some embodiments the determination may occur concurrently with the downloading. Different manners of determining whether more read operations are desired may be implemented. For example, in some embodiments a count of a number of read operations to be performed to obtain all the requested information may be maintained. Upon the sensing of each data group (i.e., corresponding to a read operation), the count may be decremented. When the count reaches zero, it is determined that no further read operations are desired.

If it is determined at diamond 60 that further read operations are desired, control returns to block 30 for initiation of the next read operation. If instead it is determined that no further read operations are desired, control may pass to block 70. There, a requester of the data, e.g., a host controller, may be informed that the read operations have been completed, and that the desired information is available in the volatile array (block 70). Accordingly, the data may be read from the volatile array (block 80). For example, the host controller may download the data from the volatile array when it is informed that all of the data is present in the volatile array. Accordingly, during the reading and downloading of the information from the nonvolatile array to the volatile array, the host controller may be performing other activities, thereby improving system performance. Further, the host will not incur any latency or wait states when reading from the volatile array.

Figure 2:
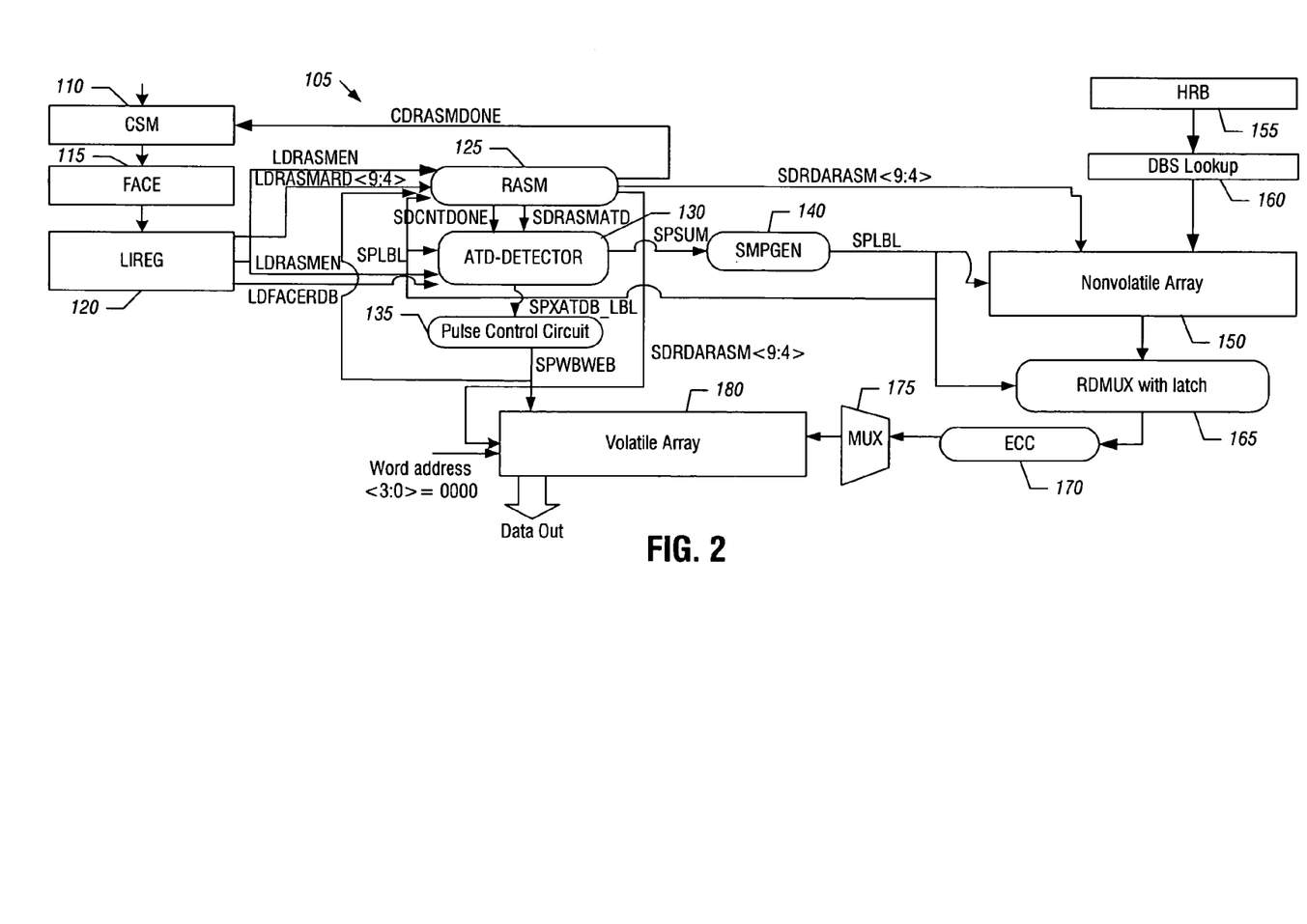
FIG. 2 is a block diagram of a memory in accordance with one embodiment of the present invention.

Referring now to FIG. 2, shown is a block diagram of a memory 105 in accordance with one embodiment of the present invention. As shown in FIG. 2, memory 105 may include both volatile and nonvolatile arrays, namely a nonvolatile array 150 and a volatile array 180. In various embodiments, nonvolatile array 150 may be a flash memory and volatile array 180 may be a static random access memory (SRAM) array or another volatile memory array. As shown in FIG. 2, memory 105 may also include various control and timing circuits to enable read and write operations. While shown with the specific components in FIG. 2, it is to be understood that other configurations are possible. For example, multiple arrays may be present. Furthermore, additional portions of memory 105 are not shown for ease of illustration in FIG. 2. For example, a write state machine (WSM) and a read state machine (RSM) used to control execution of certain write and read operations are not shown. For example, the RSM may execute a read command requesting a single data group, rather than multiple data groups.

In various embodiments, a plurality of read operations may be performed to obtain data stored in nonvolatile array 150 using a single read command. In such manner, multiple data groups (e.g., each of multiple word length) may be retrieved from nonvolatile array 150 and stored in volatile array 180 for later access by a customer (e.g., a host controller).

Still referring to FIG. 2, a command state machine 110 may be coupled to receive incoming commands from the customer. If a read command (e.g., a read buffer command, meaning that the customer wants to read a large amount of data from a buffer (i.e., nonvolatile array) of memory 105) is received, a control signal such as a wakeup signal is sent to a flash algorithmic control engine (FACE) 115. In various embodiments, the read command may be a single command to initiate multiple read operations. Upon receiving such a command, FACE 115 may be enabled to execute microcode for performing the multiple read operations. Specifically, FACE 115 may provide information for use in performing the read operations, namely an array read address and a read count. The array read address may correspond to the first address within nonvolatile array 150 at which desired data is located. The count may correspond to the number of read operations to be executed to obtain all of the desired data.

Accordingly, FACE 115 writes an address that it may receive from a host register bank (HRB) 155 to a nonvolatile register (LIREG) 120. In turn, LIREG 120 stores the load address, which is to be provided to a read acceleration state machine (RASM) 125. Thus as shown in FIG. 2, LIREG 120 provides a column address (LDRASMARD <9:4>) to RASM 125. HRB 155 may also provide the read count to FACE 115. Upon receipt of this information, FACE 115 may provide the count to LIREG 120 and generate a RASM control signal (LDRASMEN) that is provided to enable RASM 125. In various embodiments, FACE 115 may hand control over to RASM 125 upon providing the array read address, read count, and the control signal. Accordingly, FACE 115 may enter into a low power state until RASM 125 later signals that the read operations have completed.

In various embodiments, RASM 125 may be a finite state machine that is operable to trigger an initial read from nonvolatile array 150 at a selected array address. Furthermore, RASM 125 may be controlled to increment the array address and compare the count of the number of read operations completed against the data count requested. The comparison may take the form of an up count or a down count, in different embodiments. In various embodiments, RASM 125 may also sequence and control the writing of the data in nonvolatile array 150 into volatile array 180. RASM 125 thus may maintain the appropriate address (sent to volatile array 180 as SDRDARASM <9:4>) in volatile array 180 corresponding to the current nonvolatile array memory location being read and downloaded into volatile array 180. At the conclusion of all read operations, RASM 125 also may terminate the read sequence.

In general, RASM 125 may perform the following functions during each read operation. First it may send a control signal to initiate the read operation. Then, when that operation has completed (i.e., the data has been sensed), it may increment the current address of the read location upon receiving a sense feedback signal from a pulse generator. While the data group sensed from nonvolatile array 150 is written through to volatile array 180, RASM 125 may initiate sensing of the next data group from nonvolatile array 150 (i.e., corresponding to the next read operation). Further, RASM 125 may control the writing of the data group into volatile array 180.

To begin a read FACE 115 sets a control bit in LIREG 120 which in turn sends a control signal to RASM 125 and to an address transition detection (ATD) detector 130. ATD detector 130 generates a trigger pulse to enable a sequence of timing pulses that controls read operations in nonvolatile array 150. The control signal (SDRASMATD) is sent from RASM 125 to ATD detector 130 after a short delay. In some embodiments, the control signal from RASM 125 may be an active low signal. Upon detection of this control signal, ATD detector 130 generates a timing control signal (SPSUM) to a pulse generator (SMPGEN) 140.

In various embodiments, SMPGEN 140 may include a timing generation circuit and associated combinational logic to generate precisely timed control signals to sequence read operations from nonvolatile array 150. Upon receipt of the timing control signal from ATD detector 130, SMPGEN 140 may generate a read pulse (SPLBL) for nonvolatile array 150. In some embodiments, the read pulse may be an active high signal that causes nonvolatile array 150 to sense data at a given location. The data is accessed and thus valid data may be sensed from nonvolatile array 150 while the read pulse is at an active high level. This sensed data may correspond to a data group substantially equal to the available bandwidth of sensing circuitry within nonvolatile array 150.

As further shown in FIG. 2, nonvolatile array 150 receives a portion of the address (namely SDRDARASM <9:4>) at which data is to be read from RASM 125. In some embodiments, the address portion received from RASM 125 may be used to walk through a row of nonvolatile array 150. Nonvolatile array 150 receives a remaining portion of the address from a host register bank (HRB) 155 via a dynamic block swapping (DBS) lookup table 160. In some embodiments, DBS lookup table 160 may take a logical block address (LBA) and convert it to a physical block address and/or substitute in other physical blocks for blocks that have been blocked out, for example, due to failures. Thus, HRB 155 and DBS lookup table 160 provide a starting physical address for the read, namely a plane, block and row address. During the multiple read operations, this address is updated with the portion of the address provided by RASM 125.

As further shown in FIG. 2, the read pulse is also provided to a multiplexer 165 and is further provided in a feedback loop to ATD detector 130 and RASM 125. Upon completion of a read operation, RASM 125 updates its internal count of read operations based on this feedback signal (SPLBL). Furthermore, ATD detector 130 uses this feedback signal to retrigger a new read sequence. Specifically, another timing control signal from ATD detector 130 to SMPGEN 140 will cause a new read pulse to be generated and the next data group corresponding to the next addresses to be read from nonvolatile array 150.

In various embodiments, nonvolatile array 150 may be a flash memory array. More particularly, nonvolatile array 150 may be a NOR-based flash array. While such arrays are typically used for code storage and oftentimes for execute-in-place (XIP) operations, in various embodiments nonvolatile array 150 may be used to store and download large amounts of data to volatile array 180. While not specifically shown in FIG. 2, it is to be understood that nonvolatile array 150 may include additional circuitry, for example, sense circuitry to sense the data output from the storage cells within nonvolatile memory 150. This sense circuitry may include a plurality of sense amplifiers, each to sense data of a single cell of the array. While the number of sense amplifiers may vary in different embodiments, in some embodiments 256 sense amplifiers may be present. Accordingly, each read operation may output 256 bits of data (i.e., 32 words).

The sensed data from nonvolatile array 150 is provided to a multiplexer 165, which may be a read multiplexer controlled by the read pulse from SMPGEN 140. Multiplexer 165 may include a set of output latches. The latches within multiplexer 165 may be configured as a latch cluster to hold the data read from nonvolatile array 150 while another read operation is initiated. In such manner, data pipelining may be effected. In parallel with such pipelining read operations, error correction processing may be handled in an error detection and correction (ECC) block 170. Furthermore, while not shown in FIG. 2, it is to be understood that other operations may be performed on the data read from nonvolatile array 150 while a read sequence proceeds in parallel.

In turn, data is provided through ECC block 170 and through a multiplexer 175 into volatile array 180, where it is stored. In various embodiments, RASM 125 may control the addressing of volatile array 180 so that data from nonvolatile array 150 is stored at addresses within volatile array 180 corresponding to the locations within nonvolatile array 150. In addition to the address portion (SDRDARASM <9:4>) provided from RASM 125, volatile array 180 may have its low order address bits set to a fixed number (e.g., all zero).

While the size of volatile array 180 may vary, in some embodiments volatile array 180 may include cells corresponding to multiple rows of nonvolatile array 150. In such manner, a large quantity of data may be read from nonvolatile array 150 without any host controller intervention. Accordingly, the host controller, after initially requesting an array read, is free to perform other tasks while memory 105 obtains all of the data and provides it to volatile array 180. That is, the host controller may perform one or more other tasks during the latency period during which nonvolatile array 180 is filled with data. Upon completion of the read operations, the host controller may return to memory 105 and read the requested data out of volatile array 180.

In such manner, embodiments of the present invention may mimic the operation of a NAND-based flash device. That is, desired data may be read out of memory 105 after a longer delay than typically present in a NOR-based memory. However, after the longer delay all of the data is available. Furthermore, the host controller can perform other activities during this longer delay. Accordingly, embodiments of the present invention may be used for data storage applications, such as storage of multimedia and other files.

As further shown in FIG. 2, a pulse control circuit 135 may receive a control signal (SPXATDB_LBL) from ATD detector 130. Pulse control circuit 135 may be used to generate a write enable signal (SPWBWEB) for volatile array 180. Furthermore, as shown in FIG. 2 this write enable signal is also fed back to RASM 125 to update the count of read operations.

Upon completion of all read operations (i.e., when a terminal count is reached), RASM 125 generates a termination signal (CDRASMDONE), which is provided to CSM 110. In turn, CSM 110 may generate a control signal to cause FACE 115 to wake up and initiate execution of any clean up operations to prepare memory 105 for other operations.

When the terminal count has been reached, RASM 125 also generates a completion count signal (SDCNTDONE) to ATD detector 130. Upon receipt of this completion signal, ATD detector 130 prevents the final read pulse feedback signal from SMPGEN 140 from retriggering another read pulse sequence. Accordingly, the sensing cycle and thus the multiple read operations are completed.

Figure 3:
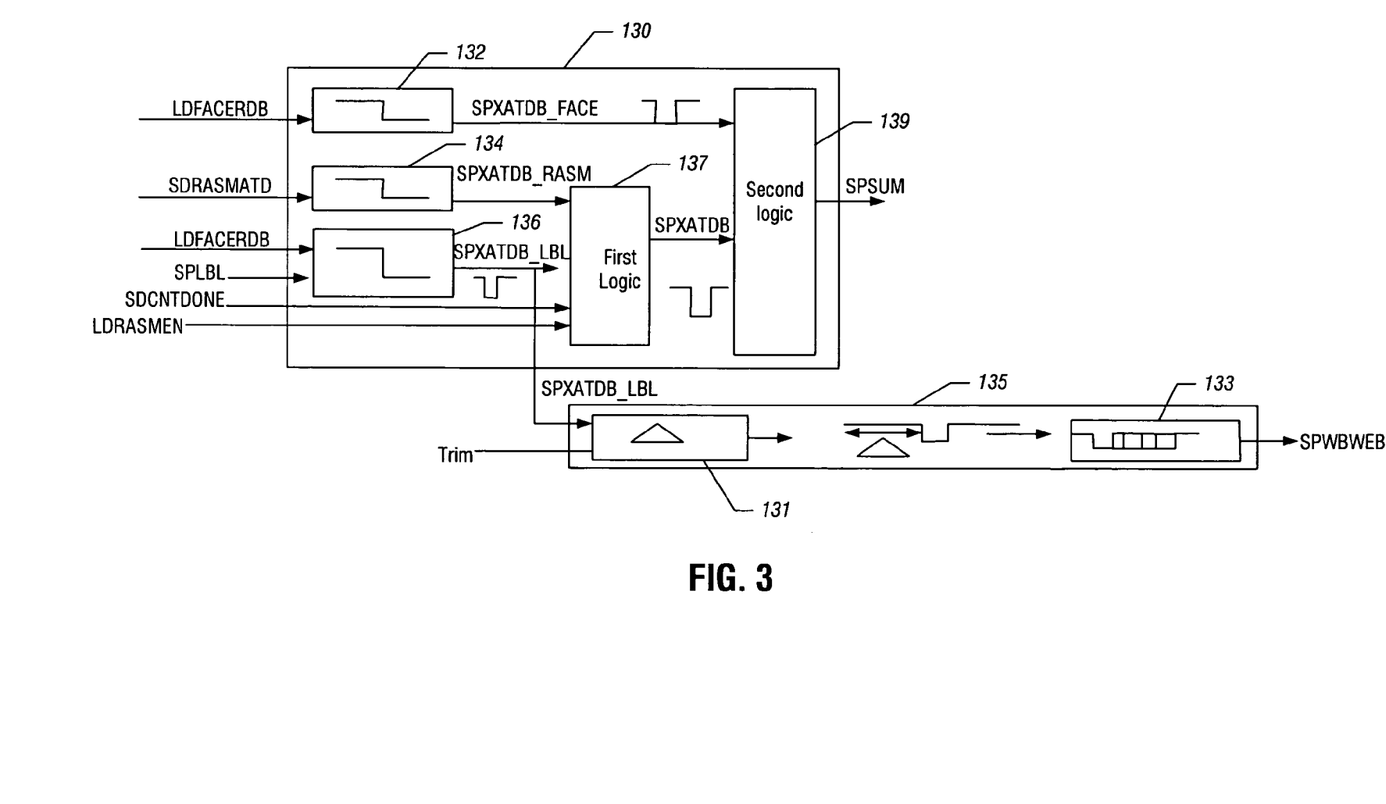
FIG. 3 is a block diagram of control circuitry in accordance with an embodiment of the present invention.

Referring now to FIG. 3, shown is a block diagram of a more detailed view of ATD detector 130 and pulse control circuit 135 in accordance with an embodiment of the present invention. As shown in FIG. 3, ATD detector 130 may include a plurality of edge detectors, namely a first edge detector 132, a second edge detector 134, and a third edge detector 136. In some embodiments, each of the edge detectors may be falling edge detectors, although the scope of the present invention is not so limited.

As shown in FIG. 3, a FACE control signal (LDFAC-ERDB) for causing read operations according to a FACE-controlled mode is received from LIREG 120 by first edge detector 132. Upon detecting a falling edge of this signal, edge detector 132 sends a pulse signal (SPXATDB_FACE) to a second logic block 139, which will be discussed further below. Second edge detector 134 is coupled to receive a control signal (i.e., SDRASMATD) from RASM 125 that is used to initiate a read pulse sequence. Upon detection of a falling edge of the control signal, edge detector 134 sends a control signal (SPXATDB_RASM) to a first logic block 137, which will be discussed further below.

Finally, a third edge detector 136 is coupled to receive the feedback signal (SPLBL) from SMPGEN 140, as well as the FACE control signal from FACE 115. Upon the falling edge of the feedback signal, third edge detector 136 may generate a control signal (SPXATDB_LBL) that is provided to first logic block 137. Furthermore, this control signal is provided to pulse control circuit 135, as will be discussed further below. However, an enabled FACE control signal prevents the generation of this signal during a FACE-controlled read mode or during verify operations, when ECC processing is not desired.

As shown in FIG. 3, first logic block 137 receives the completion signal from RASM 125, in addition to the RASM enable signal and the outputs of second edge detector 134 and third edge detector 136. Based upon these multiple inputs, first logic block 137, which in various embodiments may be combinational logic, may generate a pulse control signal (SPXATDB) that is provided to second logic block 139. Specifically, when the completion signal is at a logic low and the RASM enable signal is at a logic high level, a falling edge of the feedback signal generates the pulse control signal. In turn, the falling edge of this pulse control signal from first logic block 137 provided to second logic block 139, which in various embodiments may also be combinational logic, may generate the timing control signal (SPSUM) for SMPGEN 140. However, upon completion of the desired number of read operations, the conclusion signal from RASM 125 will act to disable the output of first logic block 137, also disabling the output of second logic block 139. In such manner, read pulses from SMPGEN 140 may be terminated upon the conclusion of the desired number of read operations.

As further shown in FIG. 3, pulse control circuit 135 may receive a trim signal in addition to the control signal (SPXATDB_LBL) from third edge detector 136. Pulse control circuit 135 may be used to delay a write pulse and then extend it to meet the write timing requirements of volatile array 180. Thus, the write enable signal for nonvolatile array 180 may be set to ensure that incoming data is fully written into the array before data of a next read operation is written. Specifically, as shown in FIG. 3, pulse control circuit 135 includes a delay element 131. In various embodiments, the timing of delay element 131 may correspond to the time needed for ECC and any other processing. In various embodiments, the duration of the delay may be trimmable based on a trim signal received from storage cells, such as flash cells set during a sort operation.

The delayed signal from delay element 131 may be coupled to a pulse extender 133, which may extend the rising edge of the pulse. Specifically, pulse extender 133 may extend the rising edge of the pulse to ensure that data of a current operation is fully written into volatile array 180 before data corresponding to a next read operation is provided to volatile array 180. Accordingly, the output of pulse control circuit 135 is the write enable signal (SPWBWEB) that is provided to volatile array 180 and is also fed back to RASM 125, as discussed above.

Figure 4:
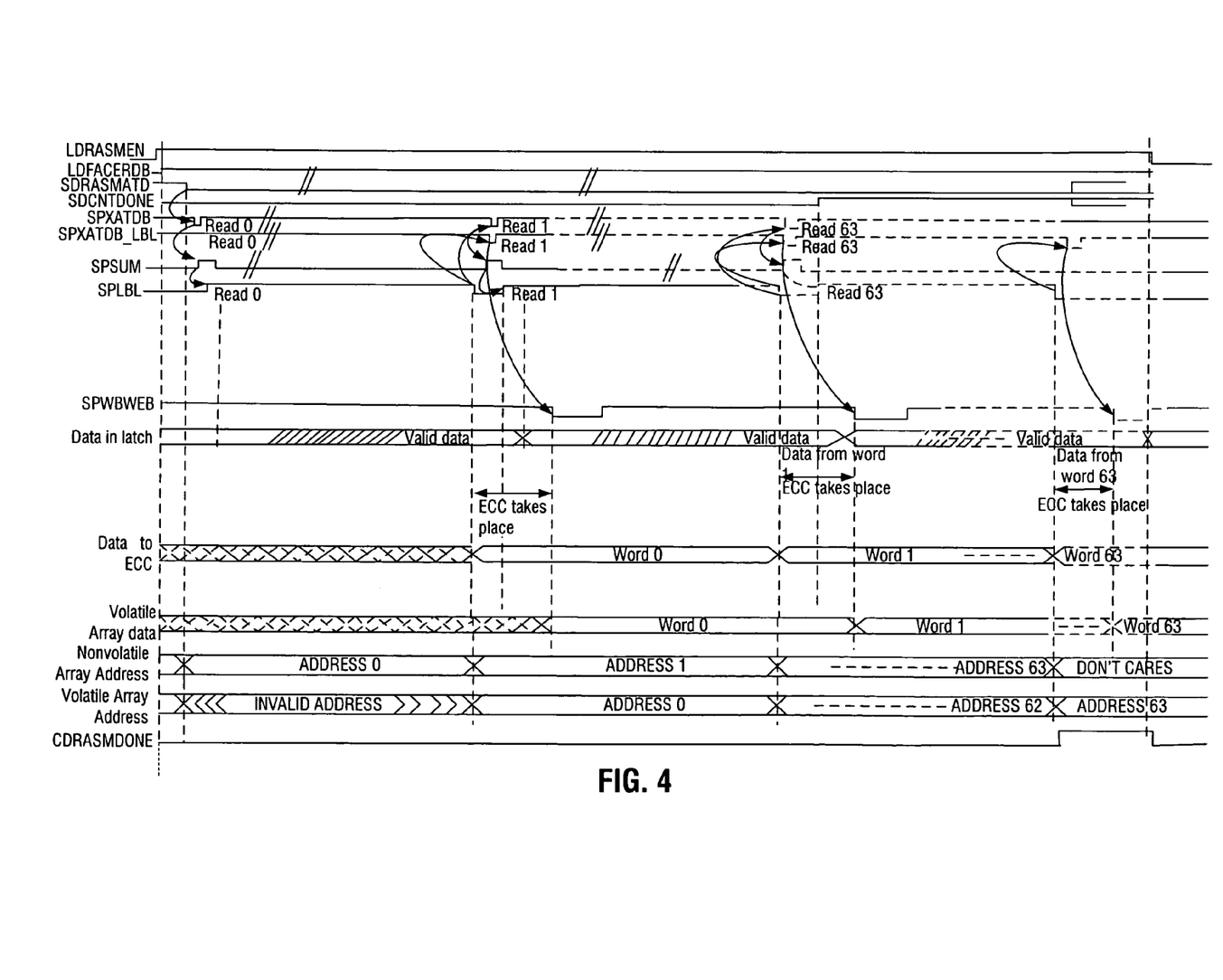
FIG. 4 is a timing diagram of multiple read operations in accordance with one embodiment of the present invention.

Referring now to FIG. 4, shown is a timing diagram of multiple read operations in accordance with an embodiment of the present invention using memory device 105 of FIG. 2. As shown in FIG. 4, several control signals, namely the RASM enable signal (LDRASM) and the FACE control signal (LDFACERDB), remain at an active high level during the multiple read operations. To begin the initial read, first the control signal generated by RASM 125, namely SDRASMATD, is transitioned to an active low state, which causes a negative pulse (SPXATDB) within ATD detector 130 that in turn generates a positive-going timing control signal (SPSUM) that is provided to SMPGEN 140 to initiate the first read pulse. Accordingly, SMPGEN 140 generates the first read pulse (SPLBL).

When the read pulse is active, valid data may be read from nonvolatile array 150 and stored in latches within multiplexer 165 (represented in FIG. 4 as "Data in latch"). When the read pulse goes low, data within the latches in multiplexer 165 may be provided to ECC block 170 (represented in FIG. 4 as "Data to ECC"), and any ECC operations, along with other processing may occur (indicated in FIG. 4 in the window "ECC takes place"). Furthermore, the falling edge of the read pulse is fed back to RASM 125 and ATD detector 130, which again triggers a negative-going pulse from RASM 125 to ATD detector 130 that in turn generates a next timing control signal to SMPGEN 140 which in turn generates a next read pulse.

The control signal SPXATDB_LBL also causes pulse control circuit 135 to delay and extend the write enable signal (SPWBWEB) that is used to write data to volatile array 180. When this write enable signal goes to its active low state, data from ECC block 170 is written into volatile array 180 (represented in FIG. 4 by "Volatile Array Data").

Note that when the array address is N in nonvolatile array 150, the address for volatile array 180 is N−1. The address for volatile array 180 may be incremented on the falling edge of the read pulse, in various embodiments.

At the conclusion of the read operations, the completion signal generated by RASM 125 (SDCNTDONE) prevents ATD detector 130 from initiating any further read sequences. Similarly, at the conclusion of the read sequence, RASM 125 generates a termination signal (CDRASMDONE) that is provided back to CSM 110, as described above. Accordingly, the read operations are completed and data may be accessed by a customer from volatile array 180. Note that while the timing diagram of FIG. 4 shows 64 read operations (each of which may read 16 words) corresponding to multiple rows of nonvolatile array 150, many more read operations are possible in other embodiments.

Thus embodiments of the present invention may operate in a manner similar to a NAND-based flash memory, although the nonvolatile array of a memory in accordance with an embodiment of the present invention may be a NOR-based flash memory. In such manner, data stored in a nonvolatile array may be downloaded into an on-chip volatile array. In various embodiments, multiple rows of the nonvolatile array may be read into the volatile array using a single read command. As described above, this single read command may internally initiate a sequence of multiple read operations, with each read cycle providing groups of data. While the size of the groups may vary, in some embodiments 16 words of data may be read during each read operation, although the scope of the present invention is not so limited.

While described herein as using a state machine, namely RASM 125 to control multiple read operations according to a single read command, in other embodiments a microcontroller may be used to control read operations. Still further, other embodiments may implement multiple such microcontrollers so that during the latency time before data is available for reading out of the volatile array, one of the microcontrollers may perform other operations.

Execution of code, other instructions or manipulation of circuitry to perform multiple read operations in accordance with an embodiment of the present invention may be implemented in a variety of locations within or external to a storage system. For example, logic may be implemented in logic circuits embedded inside a monolithic semiconductor memory device or in a software algorithm executed by a controller stacked with the memory technology inside a multi-chip memory subsystem package. Alternately, a software algorithm may be executed by an external processor separate from the memory subsystem.

Thus some embodiments may be implemented in a program. As such, these embodiments may be stored on a storage medium having stored thereon instructions which can be used to program a system to perform the embodiments. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs), erasable programmable read-only memories (EPROMs), electrically erasable programmable read-only memories (EEPROMs), flash memories, a phase change or ferroelectric memory, a silicon-oxide-nitride-oxide-silicon (SONOS) memory, magnetic or optical cards, or any type of media suitable for storing electronic instructions. Similarly, embodiments may be implemented as software modules executed by a programmable control device, such as a processor or state machine.

Figure 5:
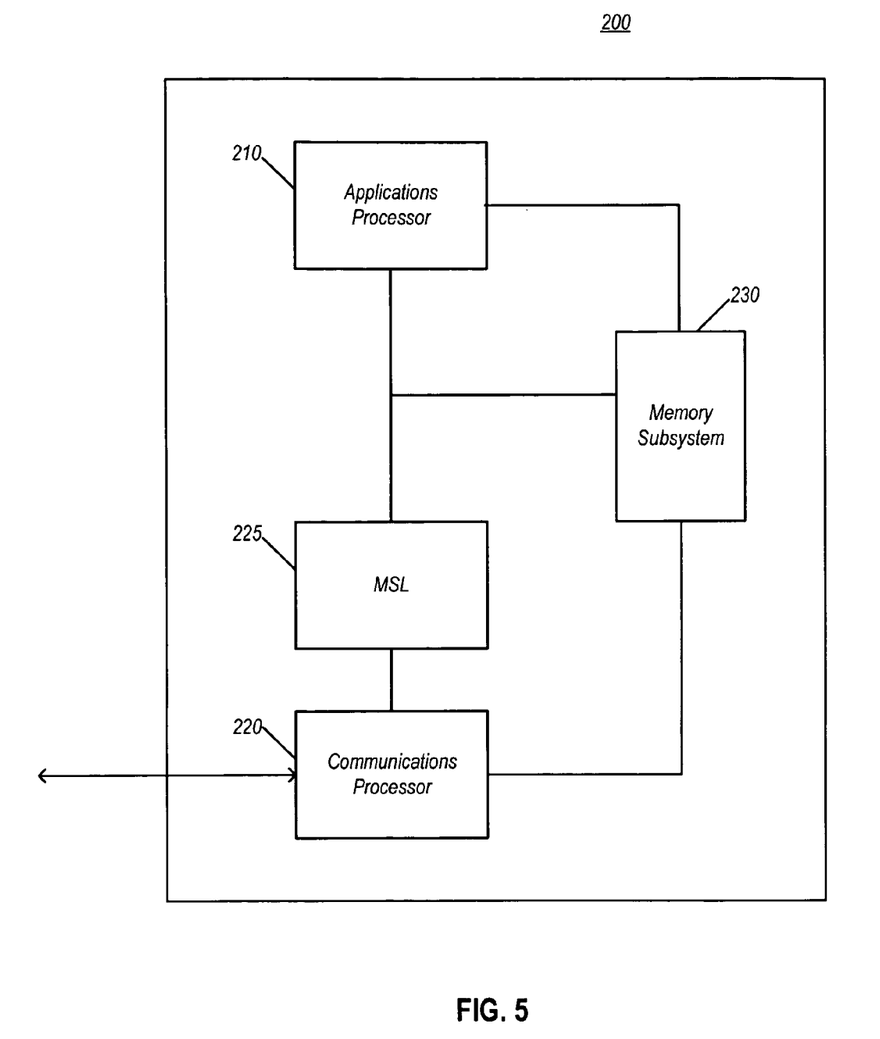
FIG. 5 is a block diagram of a system in accordance with one embodiment of the present invention.

Referring now to FIG. 5, shown is a block diagram of a wireless device in accordance with one embodiment of the present invention. While discussed in FIG. 5 as a wireless device, it is to be understood that other embodiments may be used with other types of systems, including desktop computers, servers, and the like. As shown in FIG. 5, in one embodiment wireless device 200 includes an applications processor 210, which may include a general-purpose or special-purpose processor such as a microprocessor, microcontroller, application specific integrated circuit (ASIC), a programmable gate array (PGA), and the like. Applications processor 210 may be used to execute various applications such as data processing functions, modification and manipulation of digital content and the like. In one embodiment, applications processor 210 may be a 32-bit processor, such as an XScale™ processor, available from Intel Corporation, Santa Clara, Calif. In the embodiment of FIG. 5, applications processor 210 may include a host memory controller to request data from a memory subsystem 230. However it is to be understood that in other embodiments a separate memory controller such as a memory controller hub may be present.

Applications processor 210 may be coupled to a communications processor 220, which may be a digital signal processor (DSP) based on a micro signal architecture via an internal bus, which may include a scalable link 225 (such as a mobile scalable link), which may be formed of a plurality of gating devices to scalably transfer data between the processors. It is to be understood that communications processor 220 may include various functionalities including wireless communication with external sources. For example, communications processor 220 may include a wireless interface (which in turn may have an antenna which, in various embodiments, may be a dipole antenna, helical antenna, global system for mobile communication (GSM) or another such antenna). In certain embodiments, the wireless interface may support a variety of different protocols.

Memory subsystem 230 may be coupled to both applications processor 210 and communications processor 220, in certain embodiments. Memory subsystem 230 may include both volatile and non-volatile memory, such as a RAM array such as a dynamic RAM (DRAM) and/or a static RAM (SRAM) array and a flash memory array in accordance with an embodiment of the present invention.

While shown in FIG. 5 as separate components, it is to be understood that in other embodiments two or more of the components may be integrated into a single device, such as a single semiconductor device.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a memory including:
a nonvolatile array;
a volatile array coupled to the nonvolatile array to store data read from the nonvolatile array before the data is sent from the memory;
a read state machine coupled to the nonvolatile array to initiate a plurality of read operations from the nonvolatile array pursuant to a single read command;
a timing generator coupled to the read state machine to generate a read pulse to execute a read operation in the nonvolatile array, wherein the read pulse to cause the read state machine to initiate a next one of the plurality of read operations; and
a pulse controller coupled to the volatile array to control a timing and width of a write pulse for the volatile array based on the read pulse.

2. The apparatus of claim 1, further comprising a host memory controller coupled to provide the single read command to the read state machine, the host memory controller to perform at least one other task while the plurality of read operations occur.

3. The apparatus of claim 1, wherein the pulse controller is controllable based on a duration of error correction performed on the data read from the nonvolatile array.

4. The apparatus of claim 1, wherein the nonvolatile array comprises a flash memory array and the volatile array comprises a random access memory (RAM) array.

5. The apparatus of claim 4, wherein the RAM array is sized to store data corresponding to a plurality of rows of the flash memory array.

* * * * *